United States Patent [19]

Sekhon et al.

[11] 4,047,198
[45] Sept. 6, 1977

[54] TRANSISTOR COOLING BY HEAT PIPES HAVING A WICK OF DIELECTRIC POWDER

[75] Inventors: Kalwant S. Sekhon, Fullerton; Lloyd A. Nelson, Villa Park; John E. Fritz, Jr., Anaheim, all of Calif.

[73] Assignee: Hughes Aircraft Company, Culver City, Calif.

[21] Appl. No.: 678,336

[22] Filed: Apr. 19, 1976

[51] Int. Cl.² ............ H01L 23/02; H01L 25/04
[52] U.S. Cl. ............................ 357/82; 357/74; 165/32; 165/80; 165/105; 174/16 HS
[58] Field of Search ............ 357/82, 74; 165/105, 165/32, 80; 174/16

[56] References Cited

U.S. PATENT DOCUMENTS 3,673,306  6/1972  Kirkpatrick .................. 357/82

OTHER PUBLICATIONS

Investigation of Novel Heat Removal Techniques for Power Transistors, ECOM Technical Report 9-73.

The Heat Pipe; by K. T. Feldman et al., Mechanical Engineering; pp. 30-33, Feb. 67.

Primary Examiner—Andrew J. James
Attorney, Agent, or Firm—Lewis B. Sternfels; W. H. MacAllister

[57] ABSTRACT

A micro-electronic package which is capable of operating with power densities extending at least to 10 kilowatts per square centimeter comprises a sealed enclosure coupled to an external heat sink and electronic devices and circuitry within the enclosure. Electrical leads extend from the electronic devices and circuitry to the outside of the enclosure to couple the devices and circuitry into a larger electrical function. A dielectric powder is adhered as a complete and conformal coating substantially to all interior surfaces of the enclosure and to all exposed surfaces of the electronic devices and circuitry, and functions as a heat pipe wick. A dielectric working fluid within the enclosure, therefore, can intimately contact all the interior and exposed surfaces to minimize the occurrence of local hot spots on the electronic devices and circuitry and to maximize heat transfer therefrom to the external heat sink.

8 Claims, 3 Drawing Figures

TRANSISTOR COOLING BY HEAT PIPES HAVING A WICK OF DIELECTRIC POWDER

BACKGROUND OF THE INVENTION

1. Field of the Invention

The present invention relates to improvements in cooling of electrical devices by heat pipe means.

2. Description of the Prior Art

The best known art which is prior to that of the present invention is contained in the final technical report, dated September 1973, under Contract DAAB07-72-C-0021 with the United States Army Electronics Command, Fort Monmouth, New Jersey. This technical report is identified as ECOM-0021-F, and by Reports Control Symbol OSD-1366. It is entitled "Investigation of Novel Heat Removal Techniques for Power Transistors", and prepared by M. A. Merrigan. Copy Number 191 of this report, filed concurrently herewith, is made a part of the file wrapper hereof.

As was stated in that report, high power solid state devices have been effectively cooled by spreading out the thermal junction so the average heat flux density is low enough to provide a low thermal resistance. Solid state devices have been developed for use at high frequency by limiting the device capacitance through minimization of device dimensions. Therefore, the problem in the design of high power, high frequency solid state devices is to overcome the inherent incompatibility between the frequency and thermal power requirements.

In the colling of high power solid state devices, such as power transistors, the overall thermal resistance from the device junction to the surrounding ambient environment may be considered in terms of a series of thermal resistances. In devices designed for higher operating frequencies, the internal resistance from junction to case will establish the limits of device performance.

Changes in chip design, to limit collector-to-base capacitance and to distribute the power dissipation more uniformly over the chip surface, have raised the upper frequency limits for high power transistors by allowing the thermal dissipation area to approach the total chip area. Current trends in transistor design involve the use of overlay emitter electrode construction and built-in diode compensation to permit higher power and higher temperature operation. The particular techniques used vary widely from manufacturer to manufacturer, even for what is nominally the same transistor. However, all of the techniques used involve distribution of the transistor junction over the surface of the chip while controlling the collector-to-base capacitance. This generally means placing limits on the chip size which, in turn, causes thermal limits on device performance. Elimination of this frequency power limit within the restrictions of present chip design required application of heat pipe cooling methods directly at the chip surface to provide a mechanism for minimization of temperature irregularities over the chip surface and reduction of the junction-to-case thermal resistance. The objective of the program was the development and demonstration of heat pipe techniques for power transistors operating in the VHF range with dissipation power of 25 watts or more. Program goals were to reduce junction temperature of 33% at a given power level over conventionally packaged devices without significant change in electrical characteristics. Volume and weight restrictions were four times and five times, respectively, of equivalent hermetically sealed devices.

Heat pipe cooling techniques were selected for the power transistor program primarily due to the high thermal conductances they provide in high power density applications. In general, a heat pipe may be defined as any closed device that thermally connects a heated area with a comparatively cold area by a vaporizable liquid, or working fluid, with continuous return of the condensate to the heated area by capillary action. The basic heat pipe structure consists of a sealed enclosure lined with a porous or other wick material which is wet with a suitable volatile liquid. No gas other than the pure vapor of the liquid is present. At normal vapor flow velocity the pressure will be nearly uniform throughout the vapor space. The temperature along the wick surface will then be essentially constant at the equilibrium temperature for the liquid-vapor interface at the given pressure.

Additon of heat at any point will cause the temperature throughout the enclosure to rise through local evaporation and condensation onto all cooler areas. Regions of the heat pipe where heat is introduced into the system are the evaporator sections, and those where heat removal takes place are the condenser sections. Several discrete evaporator and/or condenser sections can exist on a single heat pipe. The mechanisms affecting the flow of heat axially along the heat pipe are all extremely rapid and the adjustment of temperature consequently occurs almost instantaneously.

The most fundamental capability offered by heat pipes to the cooling of electronic components is the achievement of extremely high values of thermal conductance. Heat pipes have an additional advantage as thermal conductors in that they may utilize non-metallic, non-electrically conductive materials in order to maintain electrical isolation while retaining high thermal conductance. Another useful characteristic is the capability for acceptance of widely varying thermal fluxes without variation in temperature. Power density variation of 10 to 1 is possible in the evaporator area of a heat pipe without appreciable variation of evaporator surface temperature. This insensitivity to local variations in input power may be exploited in the reduction of local temperature variation or hot spotting.

Of the various characteristics of heat pipes, the one of most concern in power transistor cooling applications will be the high limiting values of local heat. The wick surface nearest the junction of the transistor will be exposed to extremely high values of heat flux. As the heat input in this evaporator section of the heat pipe is increased, the temperature at the liquid-wick-wall interface will rise to the point where nucleate boiling occurs in the adjacent liquid. The heat pipe will continue to operate if the capillary and buoyancy forces are great enough to cause convection of the vapor bubbles through the wick and into the vapor core. The high limiting values of local heat flux permit application of heat pipes to solid state device cooling. A schematic of a heat pipe configuration for the above-described application is shown in FIG. 1 of the report.

A glass fiber (Refrasil) wick was used in the heat pipe tests. The wick consisted of fiber glass strand bundles 0.004 inches (0.01 cm) in diameter spaced 0.02 inches (0.041 cm) apart over the chip surface. The open configuration was chosen because of the high heat flux density at the chip surface and low thermal conductivity of the dielectric wick material. The individual strand bundles served as a means of transfer-ring fluid from the region alongside the chip which served as a condenser when the device was base cooled to the chip surface. Surface forces distributed the fluid over the chip surface providing a flow distribution to the largest part of the chip surface while maintaining a minimum thermal path to the vapor space. A schematic of the wick placement and fluid distribution is shown in FIG. 14 of the report. The remainder of the header was covered with a mat of glass fiber to provide fluid storage and return mechanism. The glass fibers were mechanically retained on the chip surface by a surrounding ring.

Alternatively, as shown in FIG. 17 of the report, fabrication of the wick structure was accomplished by laying the primary chip wicking strands across the chip surface and retaining their ends at the edge of the substrate using epoxy resin as a binding agent. A cross strand parallel to the chip edge was then overlayed to insure good contact of the primary strands with the chip surface. This strand was also epoxied in place at the edge. The remainder of the chip mounting substrate was then covered with a pad of woven glass fiber for condenser wicking. The inner surface of the case cap was lined with a layer of glass fiber retained on the under surface of the cap by a resin bond. The case liner was allowed to project slightly below the cap surface to insure contact with the wick structure surrounding the chip. The cap was then welded in place on the header to seal the device. The required amount of the heat pipe working fluid was injected into the case.

The reported work demonstrated the feasibility of heat pipe cooling techniques for high frequency power transistor applications. A 6 dB gain with 33% reduction in junction termperature at 25 watts CW power were achieved within a standard transistor case (TO-60) and without appreciable increase in transistor weight. Electrical characteristics of the transistors appeared to be essentially unchanged by the presence of the heat pipe wick and fluid materials in contact with the chip surface.

Although the above work demonstrated the feasibility of applying heat pipe principles to electronic devices, its main disadvantage is in the specific use of fiber glass material as the heat pipe wick. Specifically, it was not possible to bring the wick material and, therefore, the working fluid, into intimate contact with each and every device surface because of bonding problems and the irregularity of the device due to topographical features and wiring connections. As a consequence, hot spots still exist to place an upper limit on the desired power densities. In addition, for high frequency devices, e.g. of 1 GHz and upwards, the glass fibers would interfere with fine lead wires and the active devices by affecting the electrical characteristics thereof. Therefore, such devices were limited to approximately a power density 1 kW/cm$^2$.

SUMMARY OF THE INVENTION

The present invention overcomes these and other problems by providing for a substantially conformal coating of dielectric powder placed throughout and over substantially all the exposed surfaces of the electronic devices and connecting circuitry as well as the interior surfaces of the enclosure. When the package is evacuated and the dielectric working fluid is placed therewithin, followed by hermetic sealing of the package, local evaporation of the dielectric working fluid on any of the transistor chip surfaces is followed by its condensation on cooler regions of the package interior. The condensed fluid in then returned to the electronic device surface by capillary flow through the wick structure, thereby providing continuous operation of a phase change cooling mechanism at the active surface of the electronic devices. This cooling mechanism operates in parallel with the normal conduction heat transfer mechanism within the enclosure and serves to reduce the enclosure-to-junction thermal resistance.

It is, therefore, an object of the present invention to enable the increase of power densities of electronic devices to at least 10 kW/cm$^2$, which is at least one order of magnitude greater than the known state of the art.

Another object is to provide for a substantially complete and conformal coating of wick material throughout and substantially on the entire internal surface of the enclosure and on all exposed surfaces of the electronic devices and circuitry.

Another object is to provide for a reduction in thermal resistance from junction-to-case as high as 80%.

Another object is to provide for a reduced thermal excursion during pulses within an electronic package.

Another object is to provide for increased reliability of electronic devices.

Another object is to provide for increased power output power for the same peak junction temperature and associated reliability.

Other aims and objects as well as a more complete understanding of the present invention will appear from the following explanation of exemplary embodiments and the accompanying drawings thereof.

DESCRIPTIONS OF THE PREFERRED EMBODIMENTS

Figure 1:
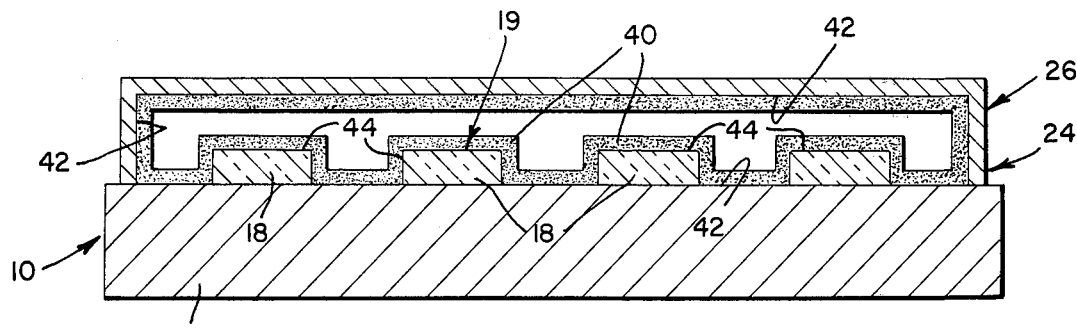
FIGS. 1–3 depict several embodiments of the present invention applied respectively to hybrid circuit packages, large scale integration (LSI) wafer packages, and transistor header packages, with or without added heat pipe vapor spaces.
Figure 2:
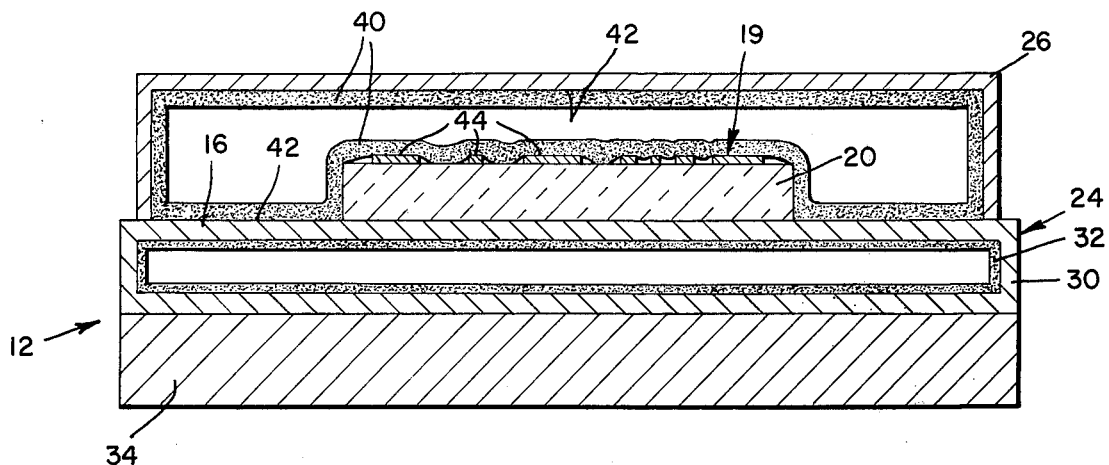
Figure 3:
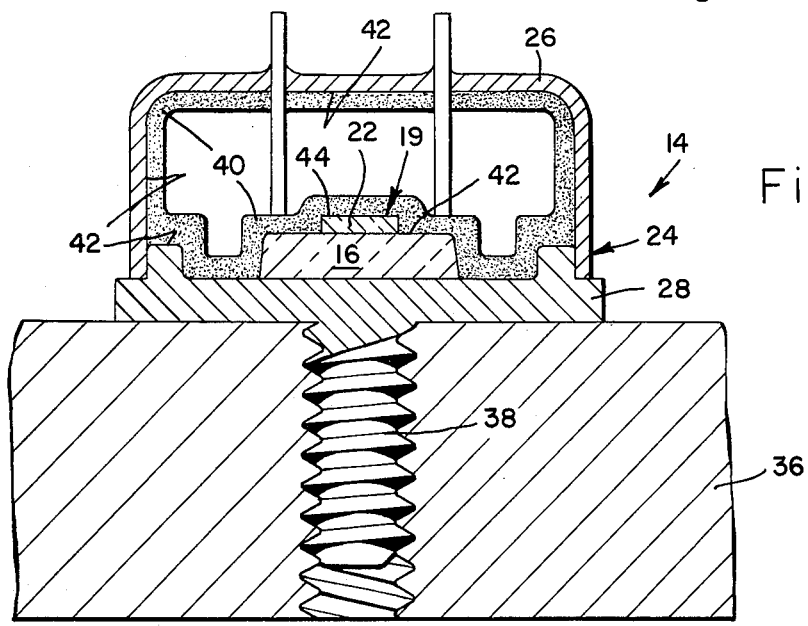

Accordingly, an electronic package figured as a hybrid circuit package 10 (FIG. 1), and LSI wafer package 12 (FIG. 2), and a transistor header package 14 (FIG. 3) all are similar in that they include a base 16 on which electronic devices and circuitry 19 are directly or indirectly mounted. In FIG. 1, such electronic devices take the form of integrated circuit chips 18. In FIG. 2, such electronic devices take the form of an LSI wafer 20. In FIG. 3, the electronic device takes the form of a single chip 22. In each case, the electronic devices and circuitry are sealed within an enclosure 24 by any suitable, well known means. Enclosure 24 may include a cover 26 secured directly to base 16, as in FIGS. 1 and 2, or to an intermediate connecting support 28, as shown in FIG. 3.

In FIG. 1, base 16 may act as a heat sink. In FIG. 2, base 16 forms one side of a heat pipe 30 having a heat pipe wick 32 and a working fluid therein. Heat pipe 30 is, in turn, attached to a heat sink 34. In FIG. 3, support 28 is secured to a heat sink 36, for example, by means of a threaded attachment 38. It is to be understood that other heat sinks may be attached to cover 26 or otherwise.

Regardless of the particular configuration of the packages depicted in FIGS. 1–3, a dielectric powder 40 is adhered to all interior surfaces 42 of enclosure 24 and all exposed surfaces 44 of electronic devices 18, 20 and 22 and defines a heat pipe wick. An example of dielectric powder suitable to this purpose includes short glass fibers approximately 0.010 to 0.050 inches (0.0254 cm to 0.127 cm) long by 0.0002 to 0.0004 inches (0.0005 cm to 0.001 cm) in diameter.

The dielectric powder must not be an electrically conductive material; otherwise, it would provide a short circuit for all the electronic devices and the circuitry, and it is not possible to sinter the material since the heat and/or pressure may destroy the electronic devices and/or their connections.

It is preferred that the dielectric powder be sprayed onto and adhered to all surfaces as a conformal coating in one of several ways. An adhesive may be first applied, followed by the powder. In addition, the powder and the adhesive with or without the coolant may be together sprayed onto the surfaces. Examples of suitable adhesives are epoxys, polyurethanes and silicones.

After placement of the dielectric powder and coolant, the package is hermetically sealed. A specific example of applying dielectric powder 40 was as follows. Glass fibers of average length of 0.03 inches (0.08 cm) and of average diameter of 0.0003 inches (0.0008 cm) were dispersed in a epoxy resin diluted with methyl ethyl ketone and painted over a transistor in a TO-60 package and dried. The package was assembled, a working fluid of a fluorochemical was inserted and the package was sealed. Tests showed cooling for power densities exceeding 10 kW/cm$^2$.

During electrical operation, local evaporation of the dielectric fluid takes place on the electronic device surface or surfaces. The vapor formed therefrom condenses on cooler regions of the package interior and is returned to the electronic device surfaces by capillary flow through the dielectric powder wick structure, thereby providing continuous operation of a phase change cooling mechanism at the active surfaces of the transistor chip or other electronic devices, according to heat pipe principles. This cooling mechanism operates in parallel with a normal conduction heat transfer mechanism within the enclosure and serves to reduce the enclosure-to-junction thermal resistance.

In tests, it has been found that the electrical characteristics of the device have not been deleteriously affected by incorporation of the inventive heat pipe structure so that it is possible to build devices having frequency limits exceeding 10 MHz and power densities at least as high as 10 kW/cm$^2$.

Although the invention has been described with reference to particular embodiments thereof, it should be realized that various changes and modifications may be made therein without departing from the spirit of the scope of the invention.

What is claimed is:

1. A microelectronic package capable of operating with power densities extending at least to 10 kW/cm$^2$ comprising:
   means for defining a sealed enclosure coupled to an external heat sink;
   means for defining electronic devices and circuitry sealed within said enclosure means;
   electrical coupling means from said electronic devices and circuitry means and extending outside of said enclosure means for electrically coupling said electronic devices and circuitry means to further electronic circuits;
   means including dielectric powder adhered substantially to all interior surfaces of said enclosure means and to all exposed surfaces of said electronic devices and circuitry means for defining a heat pipe wick substantially completely and conformally coating said interior and exposed surfaces; and
   means for defining a dielectric working fluid in said enclosure means and intimately contactable with all said interior and exposed surfaces, thereby for minimizing the occurrence of local hot spots on said electric devices and circuitry means and for maximizing heat transfer therefrom to said external heat sink.

2. A microelectronic package as in claim 1 wherein said dielectric powder is selected from the group consisting of chopped glass fibers.

3. A microelectronic package as in claim 2 wherein said working fluid means is selected from the group consisting of the fluoro chemicals.

4. A microelectronic package as in claim 2 wherein said dielectric powder means has a size of approximately 0.01 to 0.05 inches in length and 0.0002 to 0.0004 inches in diameter.

5. A microelectronic package as in claim 1 wherein said heat pipe wick means comprises a configuration defined by a spray of said dielectric powder deposited onto an adhesive applied to said interior and exposed surfaces.

6. A microelectronic package as in claim 5 wherein said configuration is further defined by the inclusion of said working fluid with said dielectric powder means in said spray.

7. A microelectronic package as in claim 1 wherein said heat pipe wick means comprises a configuration defined by a spray of both said dielectric powder and an adhesive deposited onto said interior and exposed surfaces.

8. A microelectronic package as in claim 7 wherein said configuration is further defined by the inclusion of said working fluid with said dielectric powder means in said spray.

* * * * *